United States Patent
Naidu et al.

(10) Patent No.: US 9,945,888 B2
(45) Date of Patent: Apr. 17, 2018

(54) ON-DIE MEASUREMENT TECHNIQUE FOR I/O DC PARAMETERS $V_{OL}$ AND $V_{OH}$

(71) Applicant: SanDisk Technologies Inc., Plano, TX (US)

(72) Inventors: Prasad Naidu, Bangalore (IN); Jayanth Mysore Thimmaiah, Bangalore (IN); Prashant Singhai, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 29 days.

(21) Appl. No.: 14/962,686

(22) Filed: Dec. 8, 2015

(65) Prior Publication Data

US 2017/0160317 A1   Jun. 8, 2017

(51) Int. Cl.
   *G01R 31/00* (2006.01)
   *G01R 19/165* (2006.01)
   *G01R 31/317* (2006.01)

(52) U.S. Cl.
   CPC ..... *G01R 19/165* (2013.01); *G01R 31/31715* (2013.01)

(58) Field of Classification Search
   CPC   G01R 31/26; G01R 31/2642; G01R 31/2648; G01R 31/2831; G01R 31/31702; G01R 1/0491; G01R 31/265; G01R 31/3012; G01R 31/318511
   See application file for complete search history.

(56) References Cited

U.S. PATENT DOCUMENTS

| | | | |
|---|---|---|---|
| 6,677,744 B1 * | 1/2004 | Long | G01R 31/2853 324/762.02 |
| 2011/0130981 A1 * | 6/2011 | Chaji | G09G 3/006 702/58 |

* cited by examiner

*Primary Examiner* — Tung X Nguyen
(74) *Attorney, Agent, or Firm* — Brinks Gilson & Lione

(57) ABSTRACT

A high output voltage $V_{OH}$ level and a low output voltage $V_{OL}$ level parametric test system may include test circuitry coupled to output nodes of input/output (I/O) driver circuits. The test circuitry may source and sink current to the output nodes while the I/O driver circuits are in pull down and pull up states, respectively, in order to generate output voltages on the output nodes. The parametric test system may compare the output voltages with a plurality of high and low reference levels to determine ranges of the output voltages. The ranges may be used to determine whether the I/O driver circuits pass the $V_{OH}$ and $V_{OL}$ test requirements. The $V_{OH}$/$V_{OL}$ test system may be implemented on-chip with other components of the external device, which may eliminate the need to perform other parametric testing with external test equipment.

21 Claims, 6 Drawing Sheets

ON-DIE MEASUREMENT TECHNIQUE FOR I/O DC PARAMETERS $V_{OL}$ AND $V_{OH}$

BACKGROUND

An electronic device may include an interface to communicate with other another electronic device using a communications bus. In order to send and receive signals on the communications bus, the interface may include a plurality of input/output (I/O) driver circuits configured to drive lines of the communications bus, such as by pulling up and down the levels of output voltages to respective logic high and logic low output voltage levels. In order to communicate with a wide variety of other electronic devices, the I/O driver circuits may be configured with different drive strengths for switching the output voltages from rail-to-rail (i.e., between the logic high and low logic voltage levels).

The I/O driver circuits may be subjected to testing to determine whether the I/O driver circuits meet certain DC parametric qualification requirements. Two DC parametric qualification requirements are the high output voltage level ($V_{OH}$) requirement and the low output voltage level ($V_{OL}$) requirement. The high output voltage level $V_{OH}$ may be the minimum accepted positive high output voltage level, and the low output voltage level $V_{OL}$ may be the maximum accepted positive low output voltage level. That is, if an I/O driver circuit generates its output voltage at a logic high level that is below the high output voltage level $V_{OH}$, the output voltage may not be recognized as being at the logic high level by another device with which the I/O driver circuit is communicating. Similarly, if the I/O driver circuit generates its output voltage at a logic low level that is above the low output voltage level $V_{OL}$, the output voltage may not be recognized as being at the logic low level by the other device with which the I/O driver circuit is communicating. In order to ensure signal integrity, the I/O driver circuits of a device may be subjected to $V_{OH}$ and $V_{OL}$ parametric testing to verify that the I/O driver circuits are generating output voltages that meet the $V_{OH}$ and $V_{OL}$ qualification requirements.

Some $V_{OH}$ and $V_{OL}$ parametric testing may use an external testing device (e.g., automatic test equipment (ATE)) that reads an output voltage generated by an I/O driver circuit. During $V_{OH}$ parametric testing, a test vector may generated to cause the I/O driver circuit to generate its output voltage at a logic high level. The external ATE may keep a current sink equivalent to the drive strength of the I/O driver circuit while the I/O driver circuit is driving the output voltage at the logic high level. The external testing device may read the output voltage at the logic high level and compare it with the $V_{OH}$ level to determine whether the I/O driver circuit meets the $V_{OH}$ qualification requirement. Similarly, during $V_{OL}$ parametric testing, a test vector may be generated to cause the I/O driver circuit to generate its output voltage a logic low level. The external ATE may keep the a current source equivalent to the drive strength of the I/O driver circuit while the I/O driver circuit is driving the output voltage at the logic low level. The external testing device may read the output voltage at the logic low level and compare it with the $V_{OL}$ level to determine whether the I/O driver circuit meets the $V_{OL}$ qualification requirement.

Since electronic devices of a same type (for example a particular memory device) may be produced in large quantities at or around the same time, a large number of external testing device are needed in order to test the large number of devices at the same time. In addition, the number of devices that can be tested in parallel may depend on a total number of available tester channels. Also, use of the external testing devices may require frequent cleaning of probe/tester tips after completion of a certain number of landings on dies as specified by tester requirements. In general, the added test costs and test time due to the use of external testing devices may increase the overall product cost of the electronic device. As such, an on-die solution for performing $V_{OH}$ and $V_{OL}$ parametric testing may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 1:
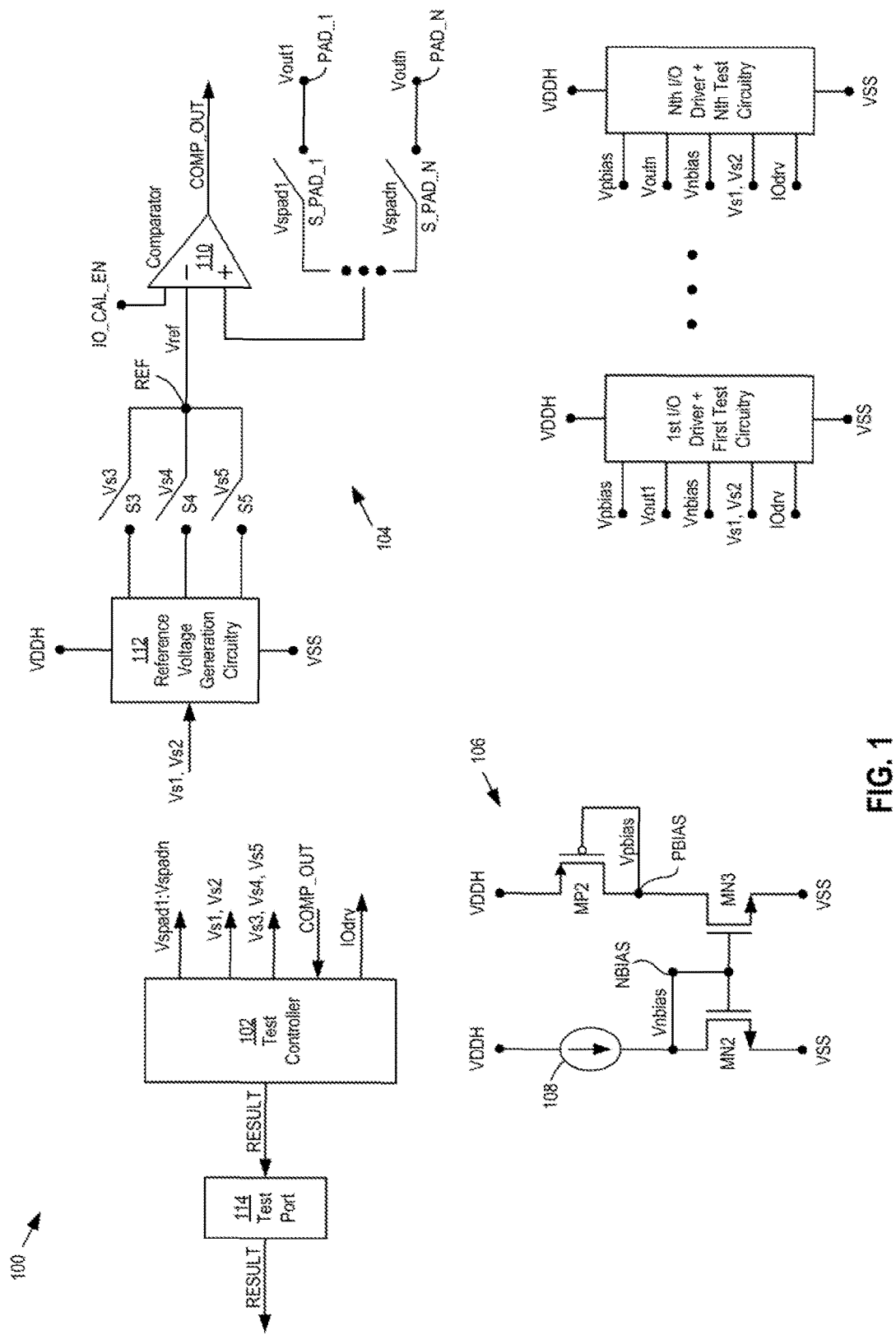
FIG. 1 is a block diagram of an example $V_{OH}/V_{OL}$ parametric test system.

The present description describes high output voltage ($V_{OH}$) level and low output voltage ($V_{OL}$) level parametric test systems and related methods of performing $V_{OH}/V_{OL}$ parametric tests on input/output (I/O) driver circuits of an electronic device. In a first example embodiment, a test system may include test circuitry, comparator circuitry, and a test controller. The test circuitry may be coupled to an output node of an input/output (I/O) driver circuit, where the test circuitry and the I/O driver circuit may be configured to generate an output voltage on the output node at a first level associated with a minimum logic high level and a second level associated with a maximum logic low level. The comparator circuitry may be configured to compare the output voltage at the first level and the second level with a reference voltage. The test controller may be configured to output an indication signal based on the comparison, where the indication signal is indicative of whether the I/O driver circuit satisfies a parametric qualification requirement.

In some example embodiments, the test circuitry may include a first switch and a second switch. The test controller may be configured to output a control signal to turn off the first switch and to turn on the second switch to cause the test circuitry to sink current from the output node to measure the output voltage at the first level associated with the minimum logic high level. Also, the test controller may be configured to output the control signal to turn on the first switch and to turn off the second switch to cause the test circuitry to source current to the output node to measure the output voltage at the second level associated with the maximum logic low level.

In some example embodiments, reference generation circuitry may be configured to generate the reference voltage. Additionally, in response to a determination to measure the output voltage at the first level, the test controller may be configured to output one or more reference control signals to cause the reference generation circuitry to output the reference voltage at one or more reference high levels. Also, in response to a determination to measure the output voltage at the second level, the test controller may be configured to output the one or more reference control signals to cause the reference generation circuitry to output the reference voltage at one or more reference low levels.

In some example embodiments, the one or more reference high levels may include a plurality of reference high levels, and wherein the one or more reference low levels may include a plurality of reference low levels. In response to the determination to test the output voltage at the first level, the test controller may be configured to output the one or more reference control signals to cause the reference generation circuity to alternatingly output the reference voltage at each of the plurality of reference high levels. Also, in response to the determination to test the output voltage at the second level, the test controller may be configured to output the one or more reference control signals to cause the reference generation circuitry to alternatingly output the reference voltage at each of the plurality of reference low levels. Further, the comparator circuitry may be configured to alternatingly compare the output voltage at the first level with each of the plurality of reference high levels and alternatingly compare the output voltage at the second level with each of the plurality of reference low levels.

In some example embodiments, the test circuitry may include a first transistor connected to the first switch, a second transistor connected to the second switch, and bias circuitry. The bias circuitry may be configured to generate a first bias to turn on the first transistor to source current to the output node when the first switch is turned on and the I/O driver circuit is configured to generate the output voltage at the logic low level. In addition, the bias circuitry may be configured to generate a second bias to turn on the second transistor to sink current from the output node when the second switch is turned on and the I/O driver circuit is configured to generate the output voltage at the logic high level.

In some example embodiments, the bias circuitry may include current mirror circuitry that includes the first transistor and the second transistor. The first transistor may be configured to mirror a source current to source the current to the output node, and the second transistor may be configured to mirror the source current to sink the current from the output node.

In some example embodiments, the test circuitry may include a plurality of test circuits coupled to a plurality of output nodes of a plurality of I/O driver circuits. The test controller may be configured to alternatingly output control signals to the plurality of test circuits and I/O driver circuits to cause the plurality of test circuits and I/O driver circuits to generate output voltages on respective output nodes at first levels associated with the minimum logic high level and second levels associated with the maximum logic low level. The comparator circuitry may be configured to sequentially compare the output voltages at the first and second levels with the reference voltage. Also, the test controller may be configured to output one or more indication signals based on the comparisons to indicate whether the plurality of I/O driver circuits has satisfied the parametric qualification requirement.

In some example embodiments, the test system may also include switching circuitry configured to selectively couple the plurality of output nodes with the comparator circuitry for the comparisons.

In another example embodiment, a parametric test method may be performed. The parametric test method may include: generating, with test circuitry and an input/output (I/O) driver circuit on an output node, a test voltage at a test level associated with one of a minimum high level or a maximum low level; comparing, with comparator circuitry, the test voltage at the test level with a reference voltage at a plurality of reference levels associated with the one of the minimum high level or the maximum low level; and identifying, with a test controller, an output voltage range for the I/O driver circuit based on comparing the test voltage at the test level with the reference voltage at the plurality of reference levels.

In some example embodiments, the method may include pulling down, with the I/O driver circuit, the test level of the test voltage while turning on a first switch to source current to the output node when the test level is associated with the maximum low level. In addition, the method may include pulling up, with the I/O driver circuit, the test level of the test voltage while turning on a second switch to sink current from the output node when the test level is associated with the minimum high level.

In some example embodiments, the method may include mirroring, with current mirror circuitry, a source current to at least one of source the current to the output node or sink the current from the output node.

In some example embodiments, the method may include: sequentially outputting, with reference generation circuitry, the reference voltage at the plurality of reference levels, and sequentially outputting, with the comparator circuitry, a plurality of comparator output signals to indicate results of the comparing of the test voltage with the reference voltage at the plurality of reference levels.

In some example embodiments, the test level may include a first test level, the plurality of reference levels may include a plurality of first reference levels, the output voltage range may include a first output voltage range, and the method may further include: after generating the test voltage at the first test level associated with the one of the minimum high level or the maximum low level and comparing the test voltage with the reference voltage: generating, with the test circuitry and the I/O driver circuit on the output node, the test voltage at a second test level associated with the other of the minimum high level or the maximum low level; comparing, with the comparator circuitry, the test voltage at the second test level with the reference voltage at a plurality of second reference levels associated with the other of the minimum high level or the maximum low level; and identifying, with the test controller, a second output voltage range for the I/O driver circuit based on comparing the test voltage at the second test level with the reference voltage at the plurality of second reference levels.

In some example embodiments, the test controller may include a first test controller and a second test controller, and the method may further include: after a last comparison of the test voltage at the first test level with the reference voltage at a last of the plurality of first reference levels, outputting, with the first test controller, a ready signal to indicate to the second controller to read a plurality of indication signals indicating the comparisons of the test voltage at the first test level with the reference voltage at the plurality of first reference levels.

In some example embodiments, the test circuitry may include first test circuitry, the test voltage may include a first test voltage, the output node may include a first output node, the I/O driver circuit may include a first I/O driver circuit, and the output voltage range may include a first output voltage range. The method may further include: after comparing the first test voltage with the reference voltage: with switching circuitry, decoupling the first output node from the comparator circuitry and coupling a second output node with the comparator circuitry, the second output node coupled to second test circuitry and a second I/O driver circuit; generating, with the second test circuitry and the second I/O driver circuit, a second test voltage at a second level associated with one of the minimum high level or the maximum low level; comparing, with the comparator circuitry, the second test voltage at the second test level with the reference voltage at the plurality of reference levels associated with the one of the minimum high level or the maximum low level; and identifying, with the test controller, a second output voltage range for the second I/O driver circuit based on comparing the second test voltage at the second level with the reference voltage at the plurality of reference levels.

In another example embodiment, an electronic device may include a circuit combination of an input/output (I/O) driver circuit and a test circuit coupled to an output node, comparator circuitry, and a test controller. The circuit combination may be configured to generate a test voltage on the output node at a first level when the I/O driver circuit is configured in a pull up state and the test circuit is configured to sink current from the output node. The circuit combination may further be configured to generate the test voltage on the output node at a second level when the I/O driver circuit is configured in a pull down state and the test circuit is configured source current from the output node. The comparator circuitry may be configured to: perform a first set of comparisons of the test voltage at the first level with a reference voltage at a plurality of high reference levels, perform a second set of comparisons of the test voltage at the second level with the reference voltage at a plurality of low reference levels, and output comparison result signals indicative of the results of the first and second sets of comparisons to a test controller. The test controller may be configured to identify the first level relative to the plurality of high reference levels and the second level relative to the plurality of low reference levels in response to receipt of the comparison result signals.

In some example embodiments, the first level may correspond to a minimum high level and the second level may correspond to a maximum low level associated with the I/O driver circuit.

In some example embodiments, the test controller may further be configured to: generate reference control signals to cause reference generation circuitry to sequentially generate the reference voltage at the plurality of high reference levels during a first test cycle and to cause the reference generation circuitry to sequentially generate the reference voltage at the plurality of low reference levels during a second test cycle.

In some example embodiments, the electronic device may include an integrated circuit that includes analog circuitry and digital circuitry. The analog circuitry may include the comparator circuitry and an analog portion of the test controller. The analog portion may be configured to output a switching control signal to the test circuit to control the sourcing of current to and the sinking of current from the output node. Also, the digital circuitry may include a digital portion of the test controller that is configured to output a test cycle enable signal to the analog portion that identifies whether the test circuit is to sink or source current to the output node.

In some example embodiments, the analog circuitry may further include current mirror circuitry configured to form a current mirror connection with the test circuitry. The current that is sourced to and sunk from the output node may be mirrored from source current flowing through the current mirror circuitry.

Other embodiments are possible, and each of the embodiments can be used alone or together in combination. Accordingly, various embodiments will now be described with reference to the attached drawings.

Exemplary Embodiments

The present description describes a high output voltage ($V_{OH}$) level and low output voltage ($V_{OL}$) level parametric test system that is configured to perform a $V_{OH}$ parametric test and a $V_{OL}$ parametric test (collectively referred to as a $V_{OH}/V_{OL}$ parametric test) on input/output (I/O) driver circuits of an electronic device. The high output voltage level $V_{OH}$ may be the minimum accepted positive high output level at which an input/output (I/O) driver circuit of the electronic device may generate an output voltage, and the low output voltage level $V_{OL}$ may be the maximum accepted positive low output level at which the I/O driver circuitry may generate the output voltage. A specification or protocol associated with the electronic device may specify the $V_{OH}$ and $V_{OL}$ levels. An I/O driver circuit may pass the $V_{OH}$ parametric test if it generates its output voltage at a logic high level that is above the $V_{OH}$ level, and may pass the $V_{OL}$ parametric test if it generates its output voltage at a logic low level that is below the $V_{OL}$ level.

The test system may be configured to, for each of a plurality of I/O driver circuits of the electronic device, identify a logic high voltage level of an output voltage relative to a set of one or more high reference voltage levels of a reference voltage, and identify a logic low voltage level of the output voltage relative to a set of one or more low reference voltage levels of the reference voltage. From the identifications, the test system may be configured to determine and/or generate test result signals that indicate whether each of the I/O driver circuits has passed or failed the $V_{OH}$ and/or $V_{OL}$ parametric tests.

FIG. 1 shows a block diagram of an example $V_{OH}/V_{OL}$ parametric test system 100 that is configured to perform a $V_{OH}/V_{OL}$ parametric test for I/O driver circuits of an electronic device. The test system 100 may include a test controller 102 that is configured to control the $V_{OH}/V_{OL}$ parametric testing, an N-number of test circuits coupled to an N-number of outputs nodes PAD_1 to PAD_N of an N-number of I/O driver circuits, comparator circuitry 104 configured to compare output voltages Vout1 to Voutn generated by the test circuits with a reference voltage Vref, and bias circuitry 106 configured to bias the test circuits to generate the output voltages Vout1 to Voutn.

Figure 2:
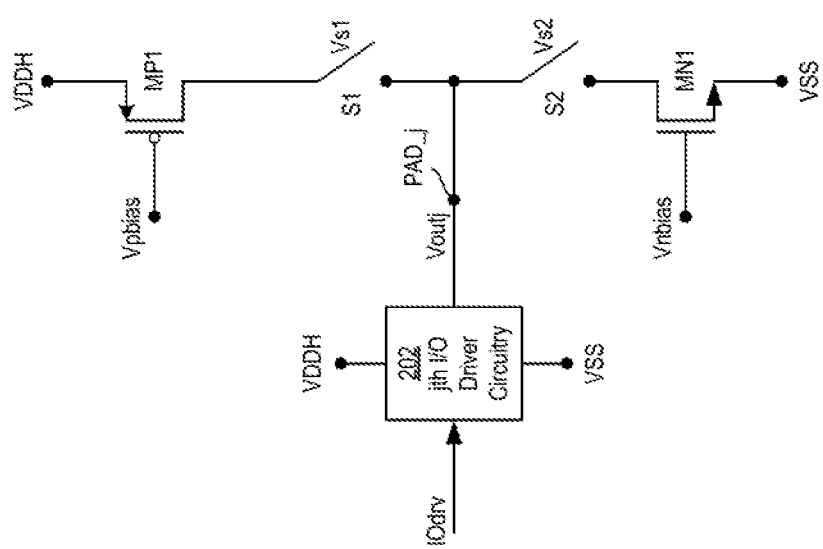
FIG. 2 is a partial circuit schematic diagram of a jth test circuit coupled to a jth output node PAD_j of a jth I/O driver circuit.

Before describing the $V_{OH}/V_{OL}$ parametric testing as performed by the $V_{OH}/V_{OL}$ parametric test system 100, reference is made to FIG. 2 to describe the test circuits in further detail. FIG. 2 shows a partial circuit schematic diagram of a circuit combination of a jth test circuit coupled to a jth output node PAD_j of a jth I/O driver circuit 202. The configuration of the jth test circuit and the jth I/O driver circuit may be representative of each of the first through Nth I/O driver circuit and test circuit combinations shown in FIG. 1. In general, the jth I/O driver circuit 202 may be configured to generate signals on a communications bus by generating a jth output voltage Voutj on a jth output node PAD_j. The jth I/O driver circuit 202 may generate the jth output voltage Voutj by pulling up a level of the jth output voltage Voutj to a logic high (e.g., a logic "1") level and by pulling down the level of the jth output voltage Voutj to a logic low (e.g., a logic "0") level. This, in turn, may pull up and down voltage levels on a line of the communications bus. The logic high level may correspond to a level of a supply voltage VDDH and the logic low level may correspond to a level of a low voltage VSS. The level of the low voltage VSS may be a ground reference voltage level, although other levels may be possible. The test controller 102 (FIG. 1) may be configured to generate and output a driver control signal IOdrv to control whether jth I/O driver circuit 202 generates the jth output voltage Voutj at the logic high level or the logic low level. Also, the jth I/O driver circuitry 202 may be implemented using a complementary metal-oxide-semiconductor (CMOS) circuit configuration, although other configurations may be possible.

The jth test circuitry may include a first switch S1 and a second switch S2 each connected to the jth output node PAD_j. The first switch S1 may be configured to receive a first switching control signal Vs1 to switch between an on state and an off state. Similarly, the second switch S2 may be configured to receive a second switching control signal Vs2 to switch between the on state and the off state. The jth test circuitry may also include a first p-channel metal-oxide-semiconductor field-effect transistor (PMOS transistor) MP1 having a source terminal connected to the supply voltage VDDH, a drain terminal connected to the first switch S1, and a gate terminal configured to receive a first bias voltage Vpbias. The jth test circuitry may further include a first n-channel metal-oxide-semiconductor field-effect transistor (NMOS transistor) MN1 having a source terminal connected to the low voltage VSS, a drain terminal connected to the second switch S2, and a gate terminal configured to receive a second bias voltage Vnbias.

As described in further detail below, the first switch S1 and the first PMOS transistor MP1 may function as a first test load for the jth I/O driver circuitry 202 for a $V_{OL}$ portion of the $V_{OH}/V_{OL}$ parametric testing. During the $V_{OL}$ portion, the test controller 102 may output the driver control signal IOdrv to cause the jth I/O driver circuitry to be in a pull down state to generate and maintain the jth output voltage Voutj at the logic low level. In addition, the first switching control signal Vs1 may turn on the first switch S1, and the second switching control signal Vs2 may turn off the second switch S2. In turn, a current source path may be established in that when the first switch S1 and the first PMOS transistor MP1 are turned on, current may be sourced to the jth output node PAD_j via the switch S1 and the first PMOS transistor MP1. The resulting voltage level of the jth output voltage Voutj when the jth I/O driver circuitry is in the pull down state and the first switch S1 and the first PMOS transistor MP1 are souring current to the jth output node PAD_j may correspond to and/or be associated with a maximum logic low voltage level. As described in further detail below, the $V_{OH}/V_{OL}$ parametric test system 100 may compare the resulting voltage level with one or more reference low levels to determine an output voltage range associated with the $V_{OL}$ portion of the parametric testing and/or whether the jth I/O driver circuitry has passed or failed the $V_{OL}$ portion.

Similarly, the second switch S2 and the first NMOS transistor MN1 may function as a second test load for the jth I/O driver circuitry 202 for a $V_{OH}$ portion of the $V_{OH}/V_{OL}$ parametric testing. During the $V_{OH}$ portion, the test controller 102 may output the driver control signal IOdrv to cause the jth I/O driver circuitry to be in a pull up state to generate and maintain the jth output voltage Voutj at the logic high level. In addition, the first switching control signal Vs1 may turn off the first switch S1, and the second switching controls signal Vs2 may turn on the second switch S2. In turn, a current sink path may be established in that when the second switch S2 and the first NMOS transistor MN1 are turned on, current may be sunk from the jth output node PAD_j to ground (VSS) via the second switch S2 and the first NMOS transistor MN1. The resulting voltage level of the jth output voltage Voutj when the jth I/O driver circuitry is in the pull up state and the second switch S2 and the first NMOS transistor MN1 are sinking current from the jth output node PAD_j may correspond to and/or be associated with a minimum logic high voltage level. As described in further detail below, the $V_{OH}/V_{OL}$ parametric test system 100 may compare the resulting voltage level with one or more reference high levels to determine an output voltage range associated with the $V_{OH}$ portion of the parametric testing and/or whether the jth I/O driver circuitry has passed or failed the $V_{OH}$ portion.

Referring back to FIG. 1, the test controller 102 may be configured to output the first and second switching control signals Vs1, Vs2 to the first and second switches S1, S2, respectively, of each of the N-number of test circuits. In addition, the bias circuitry 106 may be configured to generate the first bias voltage Vpbias and output the first bias voltage Vpbias to the gate terminals of the first PMOS transistors MP1 of each of the N-number of test circuits. Also, the bias circuitry 106 may be configured to generate the second bias voltage Vnbias and output the second bias voltage Vnbias to the gate terminals of the first NMOS transistors MN1 of each of the N-number of test circuits.

As shown in FIG. 1, the bias circuitry 106 may include a second NMOS transistor MN2, a third NMOS transistor MN3, and a second PMOS transistor MP2. The gate and drain terminals of the second NMOS transistor MN2 may be connected together to form a diode connection. The second bias voltage Vnbias may be generated at a node NBIAS of the diode connection. The gate terminals of the first transistors MN1 of the test circuitries may be connected to the NBIAS node and configured to receive the second bias signal Vnbias. A gate terminal of the third NMOS transistor MN3 may be connected to the diode connection of the second NMOS transistor MN2, Also, gate and drain terminals of the second PMOS transistor MP2 may be connected together to form a diode connection. The first bias voltage Vpbias may be generated at a node PBIAS of the diode connection. A drain terminal of the third NMOS transistor MN3 may be connected the node PBIAS of the diode connection of the second PMOS transistor.

The second NMOS transistor MN2 may be configured to receive a source current from a current source 108. The source current may generate the second bias voltage Vnbias as a fixed voltage. The gate terminal of the first NMOS transistor being connected to the node NBIAS may form a current mirror connection such that the current flowing through the first NMOS transistor MN1 to sink current away from the jth output node PAD_j (FIG. 2) is a mirrored version of the source current supplied from the current source 108. Additionally, the gate terminal of the third NMOS transistor being connected to the node NBIAS, the diode connection of the second PMOS transistor MP2, and the gate terminal of the first PMOS transistor MP1 being connected to the node PBIAS may form additional current mirror circuitries such that the current flowing through the second PMOS transistor MP2 and third NMOS transistor MN3 and the current flowing through the first PMOS transistor MP1 to source current to the jth output node PAD_j (FIG. 2) may be mirrored versions of the source current supplied from the current source 108.

The current mirror circuitry may provide a relatively high output resistance such that it helps keep the current sourced to and sunk from the output nodes PAD_1 to PAD_N constant regardless of load. Also, the width-to-length (W/L) ratios of the first NMOS transistor MN1 may be a multiple (M) times the W/L ratio of the second NMOS transistor MN1 so that the first NMOS transistors MN1 draw desired amounts of current away from the output nodes PAD_1 to PAD_N. Also, the size of the first PMOS transistors MP1 may determine the amount of the current sourced to the output nodes PAD_1 to PAD_N.

The current source 108 may be implemented in various ways. In one example configuration, the current source 108 includes an external high accuracy resistor connected to an analog test pad. In another example configuration, the current source 108 may include an internal voltage to current converter. Other configurations may be possible.

The $V_{OH}/V_{OL}$ parametric test system 100 may be configured to perform a $V_{OH}/V_{OL}$ parametric test for each of the N-number of I/O driver circuits of the electronic device. Each $V_{OH}/V_{OL}$ parametric test may include two test portions or cycles, including a first, $V_{OH}$ test portion or cycle and a second, $V_{OL}$ test portion or cycle. The system 100 may perform either the first test cycle first and then the second test cycle, or vice versa. In addition, the $V_{OH}/V_{OL}$ parametric test system 100 may perform the first and second cycles for the I/O driver circuits in various orders. In one example order, the $V_{OH}/V_{OL}$ parametric test system 100 may perform the first test cycle and the second test cycle for one I/O driver circuit, and then may perform the first and second test cycles for another I/O driver circuit, and so on until the $V_{OH}/V_{OL}$ parametric test system 100 performs the first and second test cycles for all of the I/O driver circuits. In other example order, the $V_{OH}/V_{OL}$ parametric test system 100 may perform the first test cycle for all of the I/O driver circuits first, and then perform the second test cycle for all of the I/O driver circuits. Various other orders may be possible.

During the first, $V_{OH}$ test cycle, a comparator 110 of the comparator circuitry 104 may be configured to compare a logic high level of an output voltage generated by a test circuit with a reference voltage Vref generated at a plurality of high reference levels associated with the logic high level. In one example, the plurality of high reference levels may include three references levels, including a low level, intermediate level, and a high level. A number of reference levels other than three may be possible. In addition, the levels may be spaced apart equally, such as in 100 millivolt (mV) increments as an example.

Similarly, during the second, $V_{OL}$ test cycle, the comparator 110 may be configured to compare a logic low level of an output voltage generated by a test circuit with the reference voltage Vref generated at a plurality of low reference levels associated with the logic low level. In one example, the plurality of low reference levels may include three references levels, including a low level, intermediate level, and a high level. A number of reference levels other than three for each of the high reference levels or the low reference levels may be possible. In addition, the levels may be spaced apart equally, such as in 100 millivolt (mV) increments as an example. For example, the low, intermediate, and high levels of the high reference levels may be 2.75 V, 2.85 V, and 2.95 V respectively, and the low, intermediate, and high levels of the low reference levels may be 250 mV, 350 mV, and 450 mV, respectively. Other levels may be possible.

The comparator circuitry 104 may include reference voltage generation circuitry 112 that is configured to dynamically generate the reference voltage Vref at the plurality of high reference levels and the plurality of low reference levels. In one example, the reference voltage generation circuitry 112 may include resistor divider circuitry to generate the reference voltage at the different levels.

As previously described, the test controller 102 may be configured to output the first and second switching control signals Vs1, Vs2 to turn on and off the first and second switches S1, S2, of each of the N-number of test circuits. The test controller 102 may also be configured to output one or both of the first and second switching control signals Vs1, Vs2 to the reference voltage generation circuitry 112 to cause the reference voltage generation circuitry 112 to generate the reference voltage Vref at the plurality of high reference levels or at the plurality of low reference levels. For example, during the first test cycle when the test controller 102 wants a test circuit to generate an output voltage at the logic high level, the test controller 102 may output the first and second switching control signal Vs1, Vs2 to turn off the first switch S1 and turn on the second switch S2, and may also output one or both of the switching control signals Vs1, Vs2 to the reference voltage generation circuitry 112 to cause the reference voltage generation circuitry 112 to generate the reference voltage Vref at the high reference levels. Similarly, during the second test cycle when the test controller 102 wants a test circuit to generate an output voltage at the logic low level, the test controller 102 may output the first and second switching control signal Vs1, Vs2 to turn off the second switch S2 and turn on the second switch S1, and may also output one or both of the switching control signals Vs1, Vs2 to the reference voltage generation circuitry 112 to cause the reference voltage generation circuitry 112 to generate the reference voltage Vref at the low reference levels.

The comparator circuitry 104 may also include switching circuitry that is configured to dynamically adjust the state of the reference voltage generation circuitry 112 to cause the reference voltage generation circuitry 112 to generate the reference voltage Vref at a desired one of the high reference levels or a desired one of the low reference levels. In one example configuration shown in FIG. 1, the switching circuitry may include three switches, including a third switch S3, a fourth switch S4, and a fifth switch S5, to dynamically or alternatingly generate the reference voltage Vref at the three high reference levels or the three low reference levels.

In one example configuration, to cause the reference voltage generation circuitry 112 to dynamically or alternatingly generate the reference voltage Vref at the three different high reference levels or the three different low reference levels, one of the three switches S3, S4, S5 may be turned on while the other two are turned off. For example, during the first test cycle, the third switch S3 may be turned on while the fourth and fifth switches S4, S5 may be turned off to generate the high level of the three high reference levels, the fourth switch S4 may be turned on while the third and fifth switches S3, S5 may be turned off to generate the intermediate level of the three high reference levels, and the fifth switch S5 may be turned on while the third and fourth switches S3, S4 are turned off to generate the low level of the three high reference levels. Also, during the second test cycle, the third switch S3 may be turned on while the fourth and fifth switches S4, S5 may be turned off to generate the high level of the three low reference levels, the fourth switch S4 may be turned on while the third and fifth switches S3, S5 may be turned off to generate the intermediate level of the three low reference levels, and the fifth switch S5 may be turned on while the third and fourth switches S3, S4 are turned off to generate the low level of the three low reference levels. Numbers of switches other than three and/or different configurations for the switches to generate the reference voltage Vref at the different high reference levels or the different low reference levels may be possible.

The test controller 102 may be configured to determine the reference level at which it wants the reference generation circuitry 112 to generate the reference voltage Vref. The test controller 102 may further be configured to control the switching of the third, fourth, and fifth switches S3, S4, S5 in order to configure the reference voltage generation circuitry 112 in a desired state so that the reference voltage generation circuitry 112 generates the reference voltage Vref at a desired one of the high or low reference levels. The test controller 102 may be configured to output switching control signals Vs3, Vs4, Vs5 to the third, fourth, and fifth switches S3, S4, S5, respectively in order to turn on and off the third, fourth, and fifth switches S3, S4, S5 as desired.

The comparator circuitry 104 may further include output switching circuitry that is configured to selectively or alternatingly couple the comparator 110 with the N-number of output nodes PAD_1 to PAD_N. For example, as shown in FIG. 1, the output switching circuitry may include an N-number of output switches S_PAD_1 to S_PAD_N. The output switches S_PAD_1 to S_PAD_N may be alternatingly or sequentially turned on such that when one of the output switches S_PAD_1 to S_PAD_N is turned on, the others are turned off. This way, one of the output nodes PAD_1 to PAD_N is turned on one at a time. The test controller 102 may be control the on and off states of the output switches S_PAD_1 to S_PAD_N by outputting output switching control switches Vspad1 to Vspadn (denoted as Vspad1:Vspadn in FIG. 1) to the output switches S_PAD_1 to S_PAD_N. The test controller 102 may output the output switching control switches Vspad1 to Vspadn to control the output switches S_PAD_1 to S_PAD_N in accordance with the order that the parametric test system 100 performs the first and second cycles for the N-number of I/O driver circuits, as previously described.

In one example implementation, when the test controller 102 determines to perform the $V_{OH}/V_{OL}$ parametric test for the first I/O driver circuit, as an example, the test controller 102 may output a first output switching control signal Vspad1 to turn on a first output switch S_PAD_1 and output the other output switching control signals Vspad2 to Vspadn to turn off the other output switches S_PAD_2 to S_PAD_N. In turn, a first (positive) input terminal of the comparator 110 may be coupled to a first output node PAD_1 of the first I/O driver circuit.

When the test controller 102 determines to perform the first, $V_{OH}$ test cycle, the test controller 102 may output the driver control signal IOdrv to the first I/O driver circuitry to cause the first I/O driver circuitry 202 to generate the first output voltage Vout1 at the logic high level on the first output node PAD_1. The test controller 102 may also output the first and second switching control signals Vs1, Vs2 to turn off the first switch S1 and to turn on the second switch S2 of the first test circuitry coupled to the first output node PAD_1. A mirrored version of the current supplied by the current source 108 may be sunk away from the first output node PAD_1 and flow through the second switch S2 and the first NMOS while the first I/O driver circuit 202 is generating the output the first output voltage Vout1 at the logic high level. With the first output switch S_PAD_1 turned on, the resulting first output voltage Vout1 may be applied to the first input terminal of the comparator 110. The test controller 102 may also output one or both of the first and second switching control signals Vs1, Vs2 to the reference voltage generation circuitry 112 to configure the reference voltage generation circuitry 112 to generate the reference voltage Vref at the high reference levels. In addition, the test controller 102 may output the switching control signals Vs3, Vs4, and Vs5 to the third, fourth, and fifth switches S3, S4, S5 to cause the reference voltage generation circuitry 112 to alternatingly or sequentially output the reference voltage Vref at the high, intermediate, and low high reference levels in a certain order. In one example configuration, the test controller 102 may control the third, fourth, and fifth switches S3, S4, S5 so that the reference voltage Vref is generated at the high level first, then the intermediate level, and lastly the low level, although other orders are possible.

In accordance with the above example order, the test controller 102 may output the switching control signals Vs3, Vs4, and Vs5 to turn on the third switch S3 and turn off the fourth and fifth switches S4, S5. In turn, the reference voltage generation circuitry 112 may generate the reference voltage Vref at the high level, which may applied to a second (negative) input terminal of the comparator 110. The comparator 110 may then be configured to compare the first output voltage Vout1 at the logic high level with the reference voltage Vref at the high one of the high reference levels. The comparator 110 may be configured to generate an output signal COMP_OUT based on the comparison. In particular, if the first output voltage Vout1 is greater than the reference voltage Vref at the high level, then the comparator 110 may output the output signal COMP_OUT at a high level. Alternatively, if the first output voltage Vout1 is lower than the reference voltage Vref at the high level, then the comparator 110 may output the output signal COMP_OUT at a low level. The comparator 110 may send the output signal COMP_OUT back to the test controller 102. In response, the test controller 102 may record whether the first output voltage Vout1 being generated when the first I/O driver circuitry is driving the first output voltage Vout1 on the output node PAD_1 to a logic high level and the second switch S2 and first NMOS transistor MN1 are sinking current from the first output node PAD_1 is greater or less than the reference voltage Vref at the high one of the high reference levels.

After the comparison, the test controller 102 may then output the switching control signals Vs3, Vs4, Vs5 to turn on the fourth switch S4 and to turn off the third and fifth switches S3, S5. In turn, the reference voltage generation circuitry 112 may generate the reference voltage Vref at the intermediate level, which may be applied to the second input terminal of the comparator 110. The comparator 110 may then compare the first output voltage Vout1 with the reference voltage Vref at the intermediate level and output another output signal COMP_OUT back to the test controller 102 indicating whether the level of the first output voltage Vout1 is higher or lower than the reference voltage at the intermediate level. In response, the test controller 102 may record whether the first output voltage Vout1 being generated when the first I/O driver circuitry is driving the first output voltage Vout1 on the output node PAD_1 to a logic high level and the second switch S2 and first NMOS transistor MN1 are sinking current from the first output node PAD_1 is greater or less than the reference voltage Vref at the intermediate one of the high reference levels.

After the second comparison, the test controller 102 may then output the switching control signals Vs3, Vs4, Vs5 to turn on the fifth switch S5 and to turn off the third and fourth switches S3, S4. In turn, the reference voltage generation circuitry 112 may generate the reference voltage Vref at the low of the set of high reference levels, which may be applied to the second input terminal of the comparator 110. The comparator 110 may then compare the first output voltage Vout1 with the reference voltage Vref at the low level and output a third output signal COMP_OUT back to the test controller 102 indicating whether the level of the first output voltage Vout1 is higher or lower than the reference voltage Vref at the low of the set of high reference levels. In response, the test controller 102 may record whether the first output voltage Vout1 being generated when the first I/O driver circuitry is driving the first output voltage Vout1 on the output node PAD_1 to a logic high level and the second switch S2 and first NMOS transistor MN1 are sinking current from the first output node PAD_1 is greater or less than the reference voltage Vref at the low one of the high reference levels.

After the test controller 102 receives the three output signals COMP_OUT based on three comparisons and records the results, the test controller 102 may be configured to determine a range of the first output voltage Vout1. Examples ranges identified by the test controller 102 may include: higher than an all three of the high reference levels, higher than the low and intermediate levels but lower than the high level, higher than the low level but lower than the intermediate and high levels, and lower than all three of the high reference levels.

Further, based on the identified voltage range, the test controller 102 may determine whether the first I/O driver circuitry has passed or failed the $V_{OH}$ portion of the $V_{OH}/V_{OL}$ parametric test. In one particular example, if the identified range indicates that the first output voltage Vout1 is lower than all three of the high reference levels, then the test controller 102 may determine that the first I/O driver circuitry has failed the $V_{OH}$ portion of the parametric $V_{OH}/V_{OL}$ test. Otherwise, the test controller 102 may determine that the first I/O driver circuitry has passed the $V_{OH}$ portion.

In some example configurations, the test controller 102 may generate an indication or result signal RESULT that indicates the results of the first, $V_{OH}$ test cycle. As shown in FIG. 1, the test controller 102 may output the result signal RESULT to a test port 114, which in turn may output the result signal RESULT to an output device external to the electronic device. In some example configurations, the result signal RESULT may indicate the identified range. In other example configurations, the result signal RESULT may merely indicate whether the first I/O driver circuitry has passed or failed the $V_{OH}$ portion as determined by the test controller 102. The result information included in the result signal RESULT may indicate to a user (e.g., a tester) of the electronic device whether to keep or discard the electronic device, or take some further testing action. In some example configurations, the test port 114 may be a Joint Test Action Group (JTAG) port or interface, although other configurations for the test port 114 may be possible.

In addition, after the test controller 102 receives the third output signal from the comparator 110, the test controller may determine to perform the second, $V_{OL}$ test cycle for the first I/O driver circuit. The test controller 102 may keep the first output switch S_PAD_1 turned on and the other output switches S_PAD_2 to S_PAD_N turned off so that the first output voltage Vout1 is continued to be applied to the first input terminal of the comparator 110. In addition, the test controller 102 may output the driver control signal IOdrv so that the first I/O driver circuitry generates the first output voltage Vout1 at the low logic level. Also, the test controller 102 may output the first and second switching control signals Vs1, Vs2 to turn on the first switch S1 and to turn off the second switch S2 of the first test circuitry. In turn, a mirrored version of the current supplied by the current source 108 may flow through the first PMOS transistor MP1 and the first switch S1 to source current to the first output node PAD_1 of the first output voltage Vout1. The resulting first output voltage Vout1, with the first I/O driver circuitry configured to generate the first output voltage Vout1 at the logic low level and the first PMOS transistor MP1 and the first switch S1 sourcing the mirrored current to the first output node PAD_1, may be applied to the first input terminal of the comparator 110.

The test controller 102 may also output one or both of the first and second switching control signals Vs1, Vs2 to the reference voltage generation circuitry 112 to configure the reference voltage generation circuitry 112 to generate the reference voltage Vref at the low reference levels. In addition, the test controller 102 may output the switching control signals Vs3, Vs4, and Vs5 to the third, fourth, and fifth switches S3, S4, S5 to cause the reference voltage generation circuitry 112 to sequentially output the reference voltage Vref at the high, intermediate, and low of the low reference levels in a certain order. In one example configuration, the test controller 102 may control the third, fourth, and fifth switches S3, S4, S5 so that the reference voltage Vref is generated at the high level first, then the intermediate level, and lastly the low level, although other orders are possible.

In accordance with the above example order, the test controller 102 may output the switching control signals Vs3, Vs4, and Vs5 to turn on the third switch S3 and turn off the fourth and fifth switches S4, S5. In turn, the reference voltage generation circuitry 112 may generate the reference voltage Vref at the high level, which may applied to the second input terminal of the comparator 110. The comparator 110 may then compare the first output voltage Vout1 with the reference voltage Vref at the high level and output an output signal COMP_OUT back to the test controller 102 indicating whether the level of the first output voltage Vout1 is higher or lower than the reference voltage Vref at the high one of the low reference levels. In response, the test controller 102 may record whether the first output voltage Vout1 being generated when the first I/O driver circuitry is driving the first output voltage Vout1 on the output node PAD_1 to a logic low level and the first switch S1 and first PMOS transistor MP1 are sourcing current to the first output node PAD_1 is greater or less than the reference voltage Vref at the high one of the low reference levels.

After the comparison, the test controller 102 may then output the switching control signals Vs3, Vs4, Vs5 to turn on the fourth switch S4 and to turn off the third and fifth switches S3, S5. In turn, the reference voltage generation circuitry 112 may generate the reference voltage Vref at the intermediate one of the low reference levels, which may be applied to the second input terminal of the comparator 110. The comparator 110 may then compare the first output voltage Vout1 with the reference voltage Vref at the intermediate level and output another output signal COMP_OUT back to the test controller 102 indicating whether the level of the first output voltage Vout1 is higher or lower than the reference voltage Vref at the intermediate one of the low reference levels. In response, the test controller 102 may record whether the first output voltage Vout1 being generated when the first I/O driver circuitry is driving the first output voltage Vout1 on the output node PAD_1 to a logic low level and the first switch S1 and first PMOS transistor MP1 are sourcing current to the first output node PAD_1 is greater or less than the reference voltage Vref at the intermediate one of the low reference levels.

After the second comparison, the test controller 102 may then output the switching control signals Vs3, Vs4, Vs5 to turn on the fifth switch S5 and to turn off the third and fourth switches S3, S4. In turn, the reference voltage generation circuitry 112 may generate the reference voltage Vref at the low one of the low reference levels, which may be applied to the second input terminal of the comparator 110. The comparator 110 may then compare the first output voltage Vout1 with the reference voltage Vref at the low level and output a third output signal COMP_OUT back to the test controller 102 indicating whether the level of the first output voltage Vout1 is higher or lower than the reference voltage Vref at the low one of the low reference levels. In response, the test controller 102 may record whether the first output voltage Vout1 being generated when the first I/O driver circuitry is driving the first output voltage Vout1 on the output node PAD_1 to a logic low level and the first switch S1 and first PMOS transistor MP1 are sourcing current to the first output node PAD_1 is greater or less than the reference voltage Vref at the low one of the low reference levels.

After the test controller 102 receives the three output signals COMP_OUT based on three comparisons and records the results, the test controller 102 may be configured to determine a range of the first output voltage Vout1. As with the first test cycle, example ranges identified by the test controller 102 may include: higher than an all three of the low reference levels, higher than the low and intermediate levels but lower than the high level, higher than the low level but lower than the intermediate and high levels, and lower than all three of the low reference levels.

Further, based on the identified voltage range, the test controller 102 may determine whether the first I/O driver circuitry has passed or failed the $V_{OL}$ portion of the $V_{OH}/V_{OL}$ parametric test. In one particular example, if the identified range indicates that the first output voltage Vout1 is higher than all three of the low reference levels, then the test controller 102 may determine that the first I/O driver circuitry has failed the $V_{OL}$ portion of the parametric $V_{OH}/V_{OL}$ test. Otherwise, the test controller 102 may determine that the first I/O driver circuitry has passed the $V_{OL}$ portion.

In some example configurations, the test controller 102 may generate a result signal RESULT that indicates the results of the second, $V_{OL}$ test cycle. The test controller 102 may output the result signal RESULT to the test port 114, which in turn may output the result signal RESULT to an output device external to the electronic device. In some example configurations, the result signal RESULT may indicate the identified range. In other example configurations, the result signal RESULT may merely indicate whether the first I/O driver circuitry has passed or failed the $V_{OL}$ portion as determined by the test controller 102. The result information included in the result signal RESULT may indicate to a user (e.g., a tester) of the electronic device whether to keep or discard the electronic device, or take some further testing action.

After performing the first and second test cycles for the first I/O driver circuit, the test controller may output the output switching control signals Vspad1 to Vspadn to turn off the first output switch S_PAD_1 and turn on another of the output switches. The first and second test cycles may then be performed for the I/O driver circuit whose output node is now coupled to the first input terminal of the comparator 110. The $V_{OH}/V_{OL}$ parametric testing may proceed in this manner until all of the I/O driver circuits are tested or the test controller 102 otherwise determines to stop the $V_{OH}/V_{OL}$ parametric test.

Figure 3:
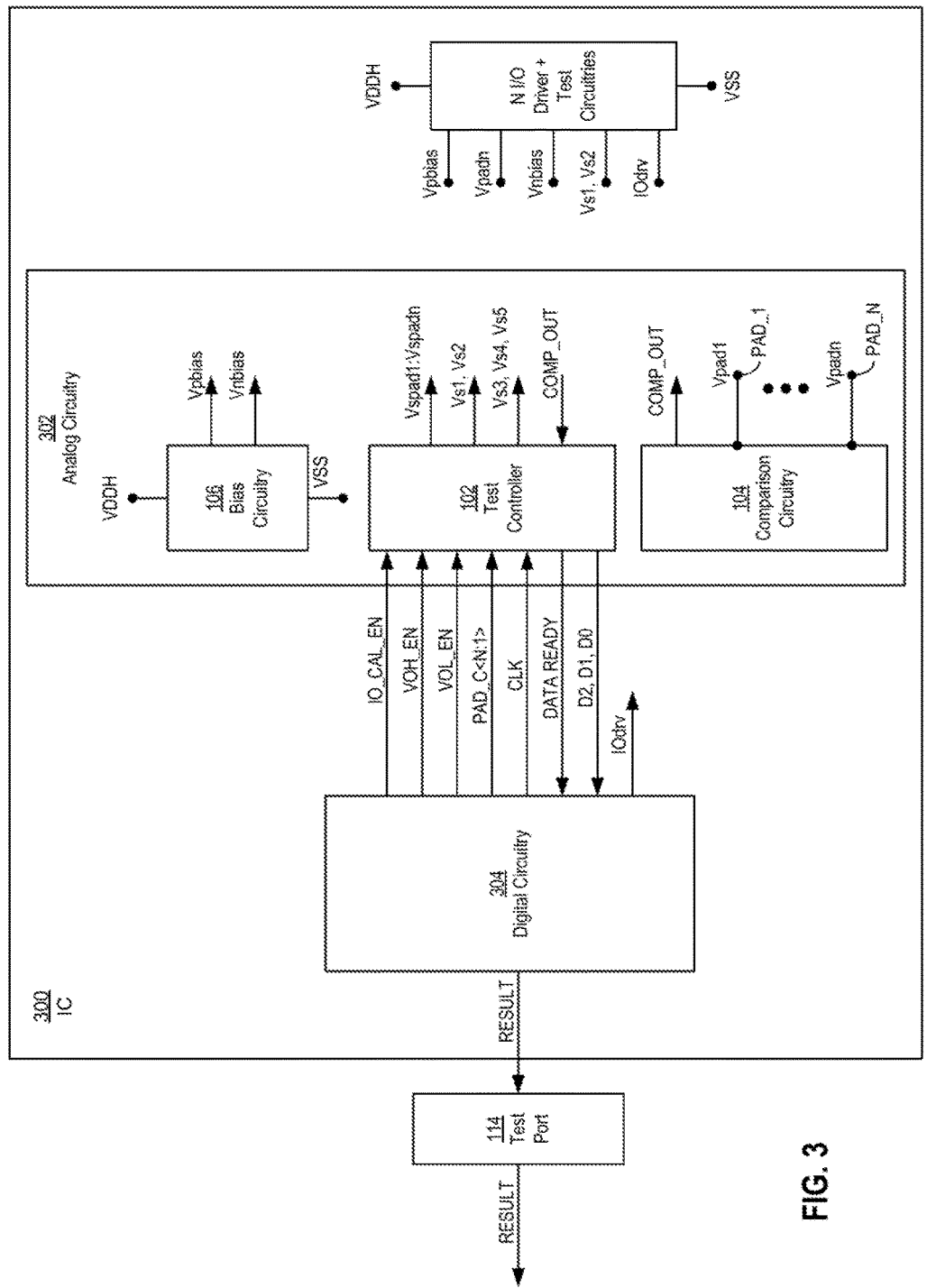
FIG. 3 is a block diagram of an example integrated circuit implementation of the $V_{OH}/V_{OL}$ parametric test system 100 of FIG. 1

The $V_{OH}/V_{OL}$ parametric test system 100 may be an internal, on-chip or on-die system of the electronic device for which it is performing the testing. This way, external test equipment and associated channels that are used to measure the output voltages at the logic high and logic low levels may not be needed, which may reduce test time and test cost. FIG. 3 shows a block diagram of an integrated circuit implementation in which the components of the $V_{OH}/V_{OL}$ parametric test system 100 of FIG. 1 may be implemented in and/or be part of the same integrated circuit (IC) 300 (e.g., a system on chip (SOC) or an application specification integrated circuit (ASIC)).

As shown in FIG. 3, the test controller 102, the comparison circuitry 104, and the bias circuitry 106 may be configured as part of analog circuitry 302 of the integrated circuit 300. In some example configurations, the test controller 102 may be configured as a state machine. In addition, the test controller 102 may be configured to communicate with and/or be controlled by digital circuitry 304, which may operate as a second test controller for the $V_{OH}/V_{OL}$ parametric testing. In addition or alternatively, when the test controller 102 is implemented as part of the analog circuitry 302, some of the functions performed by the test controller 102 as described with reference to FIG. 1 may instead be performed by the digital circuitry 304, as described in further detail below.

In general, the analog circuitry 302 of the IC 300 may include analog circuit components such as regulators, reference generators, clock generators, and power-on reset circuitry as non-limiting examples, and/or process analog signals. In addition, the analog circuitry 302 may be configured to provide the required voltages and clocks to the digital circuitry 304. The analog circuitry 302 may also be configured to control a power-up sequence and generate and output reset signals to the digital blocks of the digital circuitry 304 when the regulator voltages are under steady state. The digital circuitry 304 may include digital logic circuit components that may start to operate upon receipt of the reset signals from the analog circuitry 302. FIG. 3 shows an on-die $V_{OH}/V_{OL}$ testing scheme that combines the analog and digital portions of an integrated circuit. The analog circuitry 302 of the IC 300 may be used to provide the current sourcing and sinking for the selected I/O driver circuits. In addition, the analog circuitry 302 may measure the output voltages Vpadn of the I/O driver circuits in order to determine whether they are within the $V_{OH}$ and $V_{OL}$ specification ranges. The analog circuitry 302 may do so by generating a reference voltage Vref at various levels and comparing the reference voltage Vref using comparator logic. The digital circuitry 304 of the $V_{OH}/V_{OL}$ parametric testing scheme may use digital logic to control the $V_{OH}/V_{OL}$ parametric testing sequence. Control of the $V_{OH}/V_{OL}$ parametric testing with the digital circuitry 304 is now described.

As shown in FIG. 3, the digital circuitry 304 may send a calibration enable signal IO_CAL_EN to the test controller 102 to enable and disable the test controller 102. When enabled, the test controller 102 may be enabled or instructed to perform the $V_{OH}/V_{OL}$ parametric testing. When disabled, the test controller 102 may be disabled or instructed not to perform the $V_{OH}/V_{OL}$ parametric testing. Also, the calibration enable signal IO_CAL_EN may be used to enable and disable the comparator 110 (FIG. 1). In addition, the digital circuitry 304 may send first test cycle and second test cycle enable signals VOH_EN, VOL_EN to the test controller 102 to instruct the test controller 102 whether to perform the first test cycle or the second test cycle of the $V_{OH}/V_{OL}$ parametric testing. In some example configurations, the test controller 102 may output the first and second switching control signals Vs1, Vs2 based on the first and second test cycle enable signals VOH_EN, VOL_EN. In other example configurations, the test controller 102 may be configured to simply pass the first and second test cycle enable signals VOH_EN, VOL_EN as the switching control signals Vs1, Vs2 to the first and second switches S1, S2.

In addition, the digital circuitry 304 may be configured to send a plurality of output control signals PAD_C<N:1> that indicate to the test controller 102 which of the N-number of I/O driver circuits for which the test controller 102 is to perform the $V_{OH}/V_{OL}$ parametric testing. In some example configurations, the test controller 102 may output the output switching control signals Vspad1 to Vspadn based on the output control signals PAD_C<N:1>. In other example configurations, the test controller 102 may be configured to simply pass the output control signals PAD_C<N:1> as the output switching control signals Vspad1 to Vspadn to the output switches S_PAD_1 to S_PAD_N.

Also, the test controller 102 may be configured to output a plurality comparison result signals D2, D1, D0 to indicate the results of the three comparisons for each of the first cycle testing and the second cycle testing. For example, during the first test cycle, if the comparator 110 determined the output voltage to be greater than all three of the high reference levels, then the test controller 102 may output the comparison result signals D2, D1, D0 each at logic high levels. The test controller 102 may also output a data ready signal DATA READY that indicates to the digital circuitry 304 when to read or record the levels of the comparison result signals D2, D1, D0. In addition, the digital circuitry 304 may output a clock signal CLK to the test controller 102, which may control and/or determine when the test controller 102 outputs the various switching controls signals, data result signals, and data ready signal.

In addition, for the example IC configuration shown in FIG. 3, the digital circuitry 304, rather than the analog circuitry 302, may be configured to generate and output the driver control signal IOdrv to the I/O driver circuitries to control whether the I/O driver circuitries are configured to generate the output voltage at the logic high level or the logic low level. Also, the digital circuitry 304, rather than the analog circuitry 302, may generate and output the result signal RESULT to the test port 114. The digital circuitry 304 may generate the result signal RESULT after each of the first test cycle and the second test cycle, or once after both the first test cycle and the second test cycle are performed. Various configurations for generating the result signal RESULT may be possible.

Figure 4:
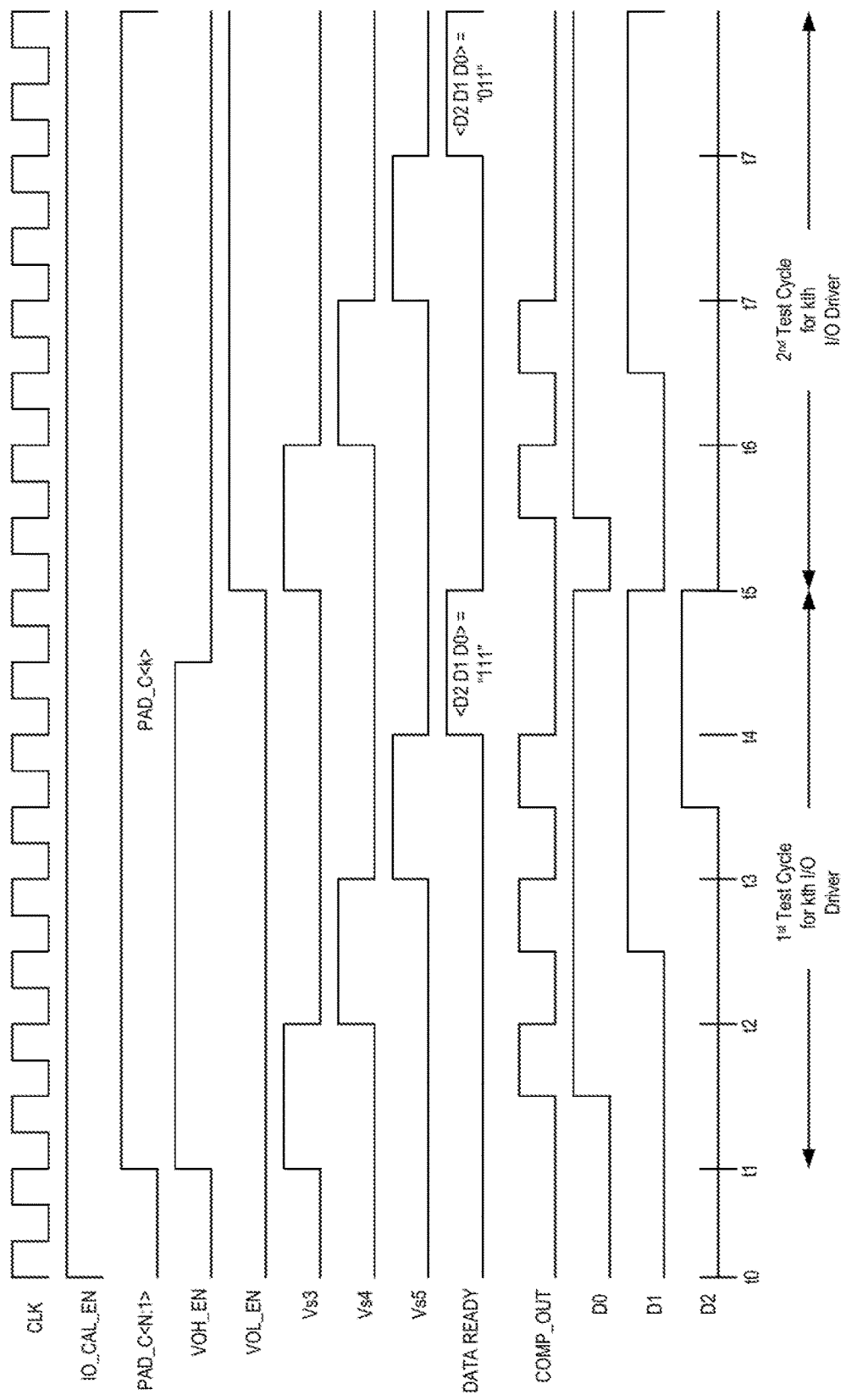
FIG. 4 is a timing diagram of the various signals generated by the $V_{OH}/V_{OL}$ parametric test system of FIGS. 1-3 for performance of a $V_{OH}/V_{OL}$ parametric test.

FIG. 4 shows a timing diagram of the various signals generated by the components of the $V_{OH}/V_{OL}$ parametric test system 100 in communication with the digital circuitry 304 as described with reference to FIGS. 1-3 during an example $V_{OH}/V_{OL}$ parametric test for a kth I/O driver circuit. The signals may be generated in accordance with clock cycles of the clock signal CLK.

At a first time t0, the digital circuit 304 may determine to perform the $V_{OH}/V_{OL}$ parametric testing for the kth I/O driver circuit and in response, output the calibration enable signal IO_CAL_EN at a high level to enable the $V_{OH}/V_{OL}$ parametric test system 100 to perform the $V_{OH}/V_{OL}$ parametric testing.

At a second time t1, the digital circuitry 304 may output the kth output control signal PAD_C<k> to a high level. In response, the test controller 102 may output a kth output switching control signal Vspadk to turn on a kth output switch S_PAD_k, which in turn may couple the kth output node PAD_k to the first input of the comparator 110. In addition, at the second time t1, the digital circuitry 304 may output the first test cycle enable signal VOH_EN high and the second test cycle enable signal VOL_EN low to indicate to the test controller 102 to perform the first test cycle for the kth I/O driver circuit. In response, the test controller 102 may output the driver control signal IOdrv so that the kth I/O driver circuit generates the kth output voltage Voutk at the logic high level. In addition, the test controller 102 may output the first and second switching control signals Vs1, Vs2 to the test circuitry of the kth I/O driver circuit to turn off a first switch S1 and to turn on a second switch S2. Doing so may cause the test circuitry to sink the current from the pulled up kth output node PAD_k in order to measure the minimum logic high level associated with the kth I/O driver circuit.

To perform the first test cycle, the test controller 102 may alternatingly turn on the three switches S3, S4, S5 in that order. As shown in FIG. 4, the test controller 102 may turn on each of the switches S3, S4, S5 for two clock cycles, although other predetermined time periods or numbers of clock cycles may be possible. At time t1, the test controller 102 may turn on the third switch S3 while keeping the fourth and fifth switches turned off. As shown in FIG. 4, during the second of the two clock cycles, the comparator 110 may output its output signal COMP_OUT. In the example shown in FIG. 4, the kth output voltage Voutk is higher than the reference voltage Vref at a first reference level of the three high reference levels when the third switch S3 is turned on, and so the comparator 110 may output its output signal COMP_OUT at a high level. In response, the test controller 102 may output the first result signal D0 at a high level to the digital circuitry 304 to indicate the comparison. After the second clock cycle, the comparator 110 may then transition its output signal COMP_OUT back low.

Subsequently, at a third time t2, the test controller 102 may turn off the third switch S3 and turn on the fourth switch S4. During the second of the two clock cycles, the comparator 110 may output its output signal COMP_OUT. In the example shown in FIG. 4, the kth output voltage Voutk is higher than the reference voltage Vref at a second reference level of the three high reference levels when the fourth switch S4 is turned on, and so the comparator 110 may output its output signal COMP_OUT at a high level. In response, the test controller 102 may output the second result signal D1 at a high level to the digital circuitry 304 to indicate the comparison. After the second clock cycle, the comparator 110 may then transition its output signal COMP_OUT back low. Subsequently, at a fourth time t3, the test controller 102 may turn off the fourth switch S4 and turn on the fifth switch S5. During the second of the two clock cycles, the comparator 110 may output its output signal COMP_OUT. In the example shown in FIG. 4, the kth output voltage Voutk is higher than the reference voltage Vref at a third reference level of the three high reference levels when the fifth switch S5 is turned on, and so comparator 110 may output its output signal COMP_OUT at a high level. In response, the test controller 102 may output the third result signal D2 at a high level to the digital circuitry 304 to indicate the comparison. After the second clock cycle, the comparator 110 may then transition its output signal COMP_OUT back low.

At a fifth time t4, after the third (last) comparison, the test controller 102 may turn off the fifth switch S5 and output the DATA READY signal at a high level to indicate to the data circuitry 304 to record the levels of the three result signals D0, D1, and D2. Based on the recording of the data result signals, the digital circuitry 304 may determine that the kth output voltage Voutk at its logic high level is greater than all three of the high reference levels. In response, the digital circuitry 304 may identify a corresponding output voltage range for the kth output voltage Voutk. Additionally, for some example configurations, the digital circuitry 304 may generate and output a result signal RESULT that indicates the identified output voltage range and/or whether the kth I/O driver circuit has passed the $V_{OH}$ parametric test. In other example configurations, the digital circuitry 304 may generate and/or output the result signal RESULT only after the second test cycle is performed.

At the sixth time t5, the digital circuitry 304 may output the first test cycle enable signal VOH_EN low and the second test cycle enable signal VOL_EN high to indicate to the test controller 102 to perform the second test cycle for the kth I/O driver circuit. In response, the test controller 102 may output the driver control signal IOdrv so that the kth I/O driver circuit generates the kth output voltage Voutk at the logic low level. In addition, the test controller 102 may output the first and second switching control signals Vs1, Vs2 to the test circuitry of the kth I/O driver circuit to turn on the first switch S1 and to turn off the second switch S2. Doing so may cause the test circuitry to source current to the pulled down kth output node PAD_k in order to measure the maximum logic low level associated with the kth I/O driver circuit.

Similar to performing the first test cycle, the test controller 102 may alternatingly turn on the three switches S3, S4, S5 in that order during the second test cycle. At the sixth time t5, the test controller 102 may turn on the third switch S3 while keeping the fourth and fifth switches turned off. As shown in FIG. 4, during the second of the two clock cycles, the comparator 110 may output its output signal COMP_OUT. In the example shown in FIG. 4, the kth output voltage Voutk is higher than the reference voltage Vref at a first reference level of the three low reference levels when the third switch S3 is turned on, and so the comparator 110 may output its output signal COMP_OUT at a high level. In response, the test controller 102 may output the first result signal D0 at a high level to the digital circuitry 304 to indicate the comparison. After the second clock cycle, the comparator 110 may then transition its output signal COMP_OUT back low.

Subsequently, at a seventh time t6, the test controller 102 may turn off the third switch S3 and turn on the fourth switch S4. During the second of the two clock cycles, the comparator 110 may output its output signal COMP_OUT. In the example shown in FIG. 4, the kth output voltage Voutk is higher than the reference voltage Vref at a second reference level of the three low reference levels when the fourth switch S4 is turned on, and so the comparator 110 may output its output signal COMP_OUT at a high level. In response, the test controller 102 may output the second result signal D1 at a high level to the digital circuitry 304 to indicate the comparison. Subsequently, at an eighth time t7, the test controller 102 may turn off the fourth switch S4 and turn on the fifth switch S5. During the second of the two clock cycles, the comparator 110 may output its output signal COMP_OUT. In the example shown in FIG. 4, the kth output voltage Voutk is lower than the reference voltage Vref at a third reference level of the three low reference levels when the fifth switch S5 is turned on, and so the comparator 110 may output its output signal COMP_OUT at a low level. In response, the test controller 102 may output the third result signal D2 at a low level to the digital circuitry 304 to indicate the comparison.

At a ninth time t8, after the third (last) comparison, the test controller 102 may turn off the fifth switch S5 and output the DATA READY signal at a high level to indicate to the data circuitry 304 to record the levels of the three result signals D0, D1, and D2. Based on the recording of the data result signals, the digital circuitry 304 may determine that the kth output voltage Voutk at its logic low level is greater than the low and intermediate levels of the low reference levels but not greater than the high level of the low reference levels. In response, the digital circuitry 304 may identify a corresponding output voltage range for the kth output voltage Voutk. Additionally, for some example configurations, the digital circuitry 304 may generate and output a result signal RESULT that indicates the identified output voltage range and/or whether the kth I/O driver circuit has passed the $V_{OL}$ parametric test. In other example configurations, the digital circuitry 304 may generate and/or output the result signal RESULT with result information for both the first and second test cycles.

The $V_{OH}/V_{OL}$ parametric testing may then be repeated for a next or another I/O driver circuit.

Figure 5:
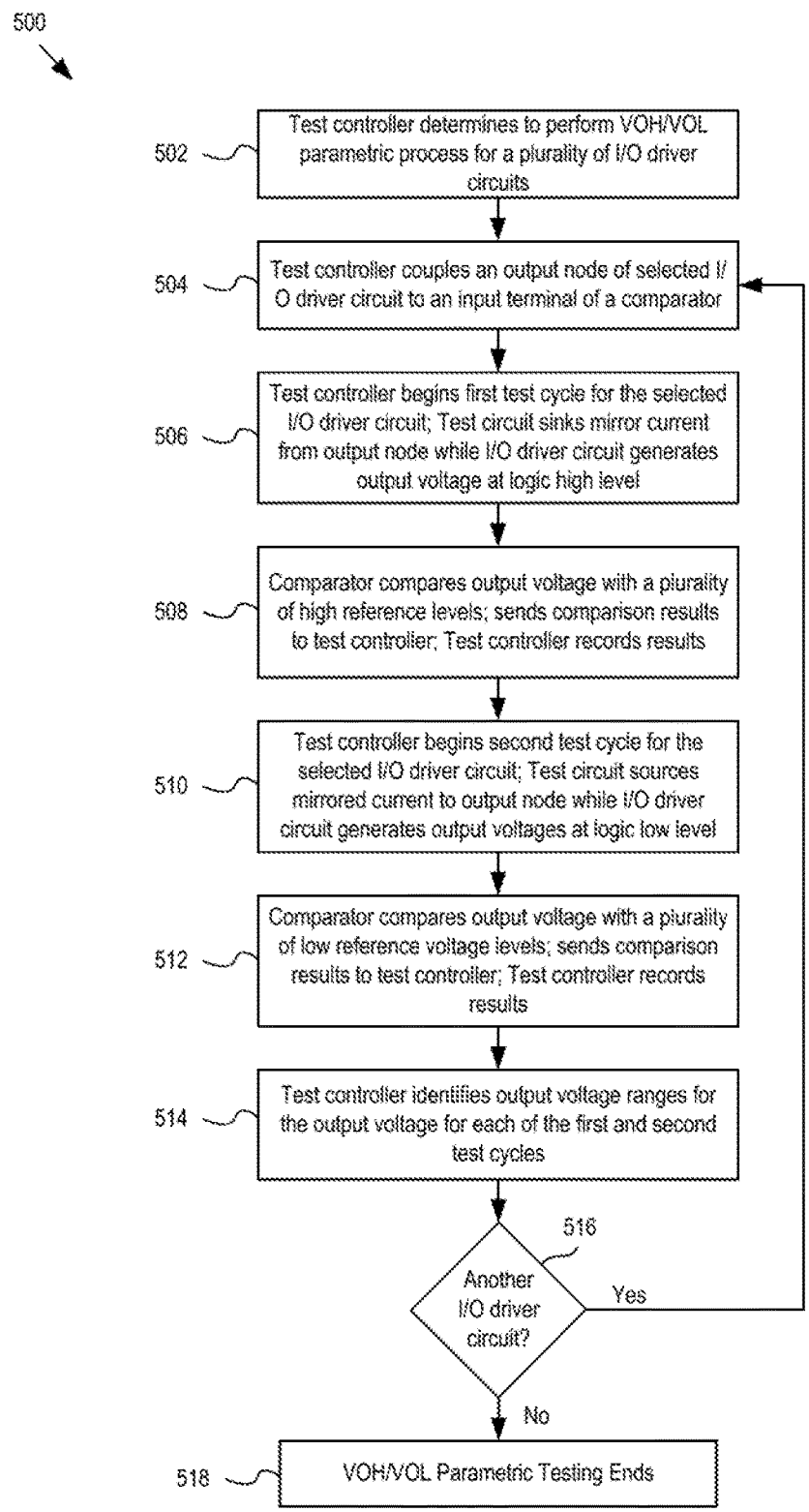
FIG. 5 is a flow chart of an example method of performing $V_{OH}/V_{OL}$ parametric testing for a plurality of I/O driver circuits of an electronic device.

FIG. 5 shows a flow chart of an example method of performing $V_{OH}/V_{OL}$ parametric testing for a plurality of I/O driver circuits of an electronic device. At block 502, at test controller of a $V_{OH}/V_{OL}$ parametric test system may determine to perform $V_{OH}/V_{OL}$ parametric testing for a plurality of I/O driver circuits. For some example methods, the test controller may make the determination in response to receipt enable signal. At block 504, the test controller may select an I/O driver circuit of a plurality of I/O driver circuits for which to perform $V_{OH}/V_{OH}$ parametric testing, and couple an output node of the selected I/O driver circuit to an input terminal of a comparator.

At block 506, the test controller may begin a first, $V_{OH}$ test cycle of the $V_{OH}/V_{OL}$ parametric testing for the selected I/O driver circuit. During the first test cycle, the test controller may output a driver control signal to cause the selected I/O driver circuit to generate an output voltage at a logic high level on an output node. In addition, the test controller may turn off a first switch and turn on a second switch to sink mirrored current from the output node in order to measure the output voltage to at a minimum logic high level. At block 508, the comparator may compare the output voltage with a reference voltage at a plurality of high reference levels. In some example methods, the comparator may compare the level of the output voltage with the plurality of high reference levels sequentially or in a predetermined order. Also, at block 508, the test controller may control switching circuitry to cause reference generation circuitry to generate the reference voltage at the high reference levels in the order. In some example methods, the reference generation circuitry may generate the reference voltage the high reference levels at predetermined time intervals according to clock cycles. Based on the comparisons, the comparator may generate output signals indicative of the comparisons and send the output signals back to the test controller. In turn, the test controller may record the comparison results.

At block 510, the test controller may begin a second, $V_{OL}$ test cycle of the $V_{OH}/V_{OL}$ parametric testing for the selected I/O driver circuit. During second test cycle, the test controller may output the driver control signal to cause the selected I/O driver circuit to generate the output voltage at the logic low level on the output node. In addition, the test controller may turn off the second switch and turn on the first switch to source mirrored to the output node in order to measure the output voltage at a maximum logic low level. At block 512, the comparator may compare the output voltage with the reference voltage at the plurality of low reference levels. In some example methods, the comparator may compare the level of the output voltage with the plurality of low reference levels sequentially or in a predetermined order. Also, at block 512, the test controller may control switching circuitry to cause reference generation circuitry to generate the reference voltage at the low reference levels in the order. In some example methods, the reference generation circuitry may generate the reference voltage at the low reference levels at predetermined time intervals according to clock cycles. Based on the comparisons, the comparator may generate output signals indicative of the comparisons and send the output signals back to the test controller. In turn, the test controller may record the comparison results.

At block 514, the test controller may identify output voltage ranges for the output voltage for each of the first and second test cycles based on the comparison results. In some example methods, the test controller may determine whether the selected I/O driver circuit passed or failed the $V_{OH}$ and the $V_{OL}$ portions of the $V_{OH}/V_{OL}$ parametric testing. As previously described, for the $V_{OH}$ portion, if the level of the output voltage is lower than all three of the high reference levels, then the test controller may identify that the selected I/O driver circuitry has failed the $V_{OH}$ portion. Similarly, for the $V_{OL}$ portion, if the level of the output voltage is higher than all three of the low reference levels, then the test controller may identify that the selected I/O driver circuitry has failed the $V_{OL}$ portion. In addition, on some example methods, the test controller may output a results method indicative of the determined output voltage ranges and/or whether the selected I/O driver circuit passed or failed the $V_{OH}/V_{OL}$ parametric testing. In other example methods, the test controller may not determine the output voltage ranges, the pass/fail results, and/or generate the result signals until after it has tested all of the I/O driver circuits.

At block 516, the test controller may determine whether there is another I/O driver circuit of the plurality of I/O driver circuits for which to perform the $V_{OH}/V_{OL}$ testing. If so, then the method may proceed back to block 504, where the test controller couples an output node of another or next I/O drive circuit to the input terminal of the comparator. If not, then the $V_{OH}/V_{OL}$ parametric testing may end at block 518.

Figure 6:
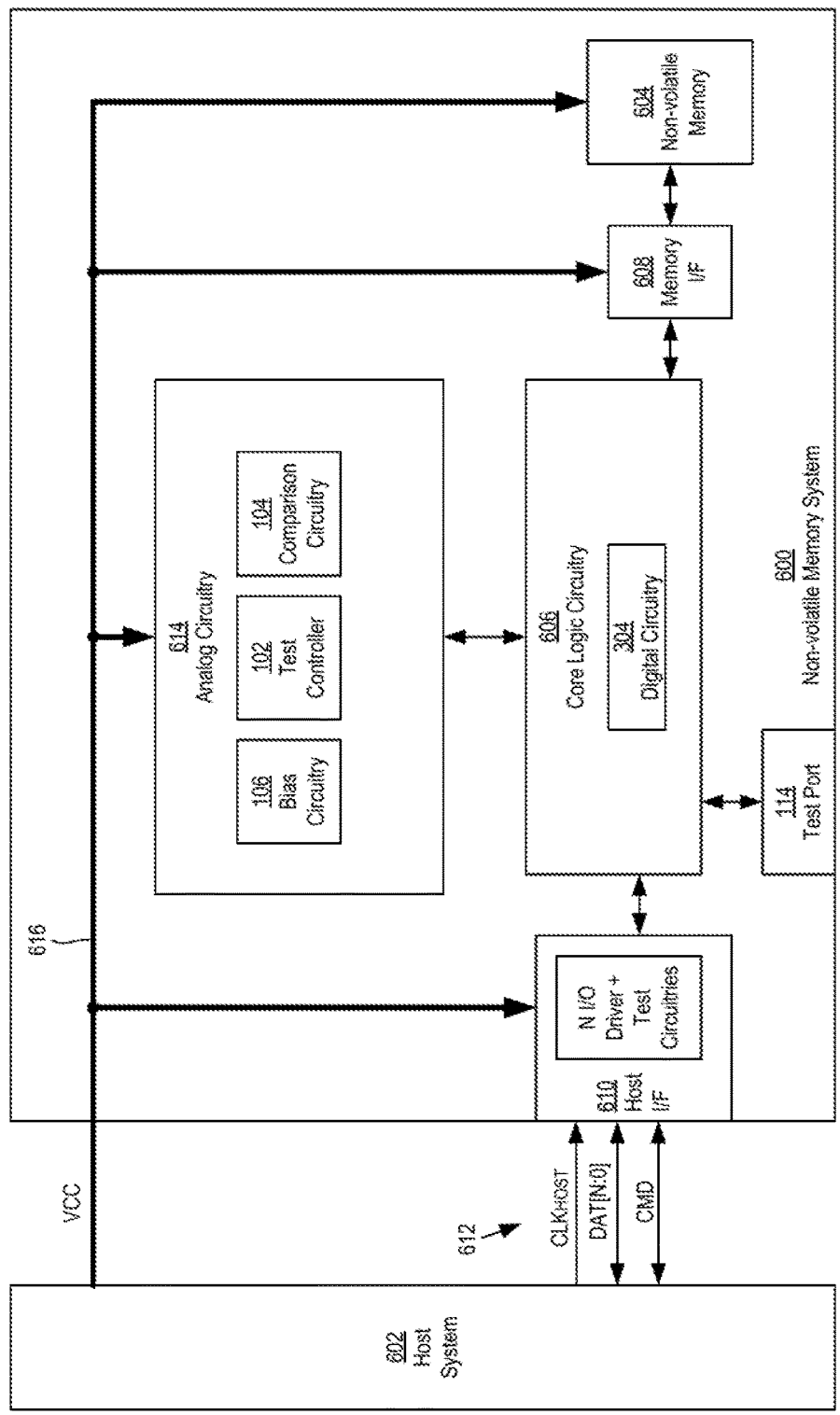
FIG. 6 is a block diagram of an example non-volatile memory system configured with the $V_{OH}/V_{OL}$ parametric test system of FIGS. 1-3 and that can perform the method of FIG. 5.

FIG. 6 shows a block diagram of an example non-volatile memory system 600 that may include the $V_{OH}/V_{OL}$ parametric system 100 of FIG. 1 and/or implemented as an integrated circuit as shown in FIG. 3, and be configured to perform the example method 500 of FIG. 3. In one embodiment, the non-volatile memory system 600 may be a card based system, such as a secure digital (SD) or a micro secure digital (micro-SD) card. In an alternate embodiment, the system 600 may be part of an embedded memory system. The non-volatile memory system 600 may be configured to be connected to and/or in communication with a host system 602. The host system 602 may be any electronic system or device that is configured to communicate and/or operate with the non-volatile memory system 600.

The non-volatile memory system 600 may include non-volatile memory 604, which may include a plurality of non-volatile memory elements or cells, each configured to store one or more bits of data. The non-volatile memory elements or cells may be any suitable non-volatile memory cells, such as NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable.

The non-volatile memory system 600 may also include core logic circuitry 606 that performs memory management functions for the storage of data in the non-volatile memory 604. Example memory management functions may include, but not limited to, communicating with the host system 602, including receiving, handling, and responding to host requests or commands, such as read, write, erase, and status requests/commands received from the host system 602; formatting the non-volatile memory 604 to ensure it is operating properly; mapping out bad memory cells; allocating spare cells to be substituted for future failed cells; and transitioning the non-volatile memory system 600 between different states, operation modes, and/or power consumption modes. In operation, when the host system 602 needs to read data from or write data to the non-volatile memory 604, it may communicate with the core logic circuitry 606.

In addition, the non-volatile memory system 600 may include a memory interface (I/F) 608 that provides an interface between the core logic circuitry 606 and the non-volatile memory 604. The core logic circuitry 606 may be configured to communicate data and commands with the non-volatile memory 604 via the memory interface 608 to store data in and/or read data from the non-volatile memory 604. The non-volatile memory system 600 may also include a host interface 610 to communicate with the host system 602. The host interface 610 may be coupled to a communications bus 612 on which the interface 610 sends and receives signals to and from the host system 602. As shown in FIG. 6, the host interface 610 may include the N-number of I/O driver circuits and associated test circuits, which may be configured to generate signals, such as by pulling up to a high level and pulling down to a low level voltages on the lines of the communications bus 612.

The communications bus 612 may include a host clock line $CLK_{HOST}$ on which the host system 602 may send a host clock signal to the non-volatile memory system 600; an N-number of data lines DAT[N:0] on which the host system 602 and the non-volatile memory system 600 may communicate data signals with each other; and a command line CMD on which the host system 602 and the non-volatile memory system 600 may communicate command signals and responses with each other. The data signals may include data that the host system 602 wants stored in or read from the non-volatile memory system 600. Command signals sent from the host system 602 may instruct or request that the non-volatile memory system 600 perform some action, such as perform an operation, transition into a certain state, or respond with requested information, as examples. The response signals sent from the non-volatile memory system 600 may acknowledge receipt of the command signals, indicate that the instructed/action is performed, or include the requested information, as examples. The host clock signal may set the frequency of the communications bus 612 and/or control the data flow by providing the times and/or rates at which the clock and data signals may be sampled by the non-volatile system 600. Also, the host system 602 may supply a supply voltage VCC on a supply line 616 to power components of the non-volatile memory system 600.

The non-volatile memory system 600 may also include analog circuitry 614 that provides a plurality of regulator supply voltages to the core logic circuitry 606, including a core supply voltage. In addition, the analog circuitry 614 may provide a base clock signal and a core voltage stabilization signal indicating whether the core supply voltage is at a stable level. The core logic circuitry 606 may send one or more control signals to the analog circuitry 614 to configure, program, enable, and/or disable various components of the analog circuitry 614.

As shown in FIG. 6, in one example configuration, the test controller 102, the comparison circuitry 104, and the bias circuitry 106 may be components of the analog circuitry 614. In addition, the digital circuitry may be components of the core logic circuitry 606. Other configurations for implementing the calibration system 100 in a non-volatile memory system that performs PVT calibration for I/O output driver circuitry may be possible.

In addition, as shown in FIG. 6, the non-volatile memory system 600 may include the test port 114, which may be configured to communicate with the core logic circuitry 606. The test port 114 may be configured to communicate with the host system 602 and/or a different external device. Also, FIG. 6 shows the test port 114 separate from the host interface 610, although for other example configurations, the test port 114 may be part of the host interface 612.

In addition, similar configurations and methods may be implemented with electronic systems or devices other than non-volatile memory systems, including those that may communicate with a host system/device using I/O driver circuitry and that may include a calibration system that sets or adjusts an impedance of the I/O driver circuitry based on process, temperature, and/or supply voltage conditions. Such electronic devices or systems may include circuit components and modules similar to those described above.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A system comprising:
    test circuitry coupled to an output node of an input/output (I/O) driver circuit, wherein the test circuitry and the I/O driver circuit are configured to generate an output voltage on the output node at a first level associated with a minimum logic high level and a second level associated with a maximum logic low level, wherein the test circuitry is further configured to at least one of:
        sink current from the output node to generate the output voltage at the first level associated with the minimum logic high level, or
        source current to the output node to generate the output voltage at the second level associated with the maximum logic low level;
    comparator circuitry configured to compare the output voltage at the first level and the second level with a reference voltage; and
    a test controller configured to output an indication signal based on the comparison, the indication signal indicating that the I/O driver circuit satisfies a parametric qualification requirement.

2. The system of claim 1, wherein the test circuitry comprises a first switch and a second switch,
    wherein the test controller is further configured to:
        output a control signal to turn off the first switch and to turn on the second switch to cause the test circuitry to sink the current from the output node to measure the output voltage at the first level associated with the minimum logic high level; and
        output the control signal to turn on the first switch and to turn off the second switch to cause the test circuitry to source the current to the output node to measure the output voltage at the second level associated with the maximum logic low level.

3. The system of claim 2, further comprising reference generation circuitry configured to generate the reference voltage, and
    wherein the test controller is further configured to:
        in response to a determination to measure the output voltage at the first level, output one or more reference control signals to cause the reference generation circuitry to output the reference voltage at one or more reference high levels; and
        in response to a determination to measure the output voltage at the second level, output the one or more reference control signals to cause the reference generation circuitry to output the reference voltage at one or more reference low levels.

4. The system of claim 3, wherein the one or more reference high levels comprises a plurality of reference high levels, and wherein the one or more reference low levels comprises a plurality of reference low levels;
    wherein the test controller is further configured to:
        in response to the determination to test the output voltage at the first level, output the one or more reference control signals to cause the reference generation circuity to alternatingly output the reference voltage at each of the plurality of reference high levels; and
        in response to the determination to test the output voltage at the second level, output the one or more reference control signals to cause the reference generation circuitry to alternatingly output the reference voltage at each of the plurality of reference low levels,
    wherein the comparator circuitry is configured to alternatingly compare the output voltage at the first level with each of the plurality of reference high levels and alternatingly compare the output voltage at the second level with each of the plurality of reference low levels.

5. The system of claim 2, wherein the test circuitry further comprises:
    a first transistor connected to the first switch;
    a second transistor connected to the second switch; and
    bias circuitry configured to generate a first bias to turn on the first transistor to source current to the output node when the first switch is turned on and the I/O driver circuit is configured to generate the output voltage at the logic low level and a second bias to turn on the second transistor to sink current from the output node when the second switch is turned on and the I/O driver circuit is configured to generate the output voltage at the logic high level.

6. The system of claim 5, wherein the bias circuitry further comprises:
    current mirror circuitry comprising the first transistor and the second transistor, wherein the first transistor is configured to mirror a source current to source the current to the output node, and wherein the second transistor is configured to mirror the source current to sink the current from the output node.

7. The system of claim 1, wherein the test circuitry comprises a plurality of test circuits coupled to a plurality of output nodes of a plurality of I/O driver circuits,
wherein the test controller is further configured to alternatingly output control signals to the plurality of test circuits and I/O driver circuits to cause the plurality of test circuits and I/O driver circuits to generate output voltages on respective output nodes at first levels associated with the minimum logic high level and second levels associated with the maximum logic low level,
wherein the comparator circuitry is further configured to sequentially compare the output voltages at the first and second levels with the reference voltage, and
wherein the test controller is further configured to output one or more indication signals based on the comparisons to indicate whether the plurality of I/O driver circuits has satisfied the parametric qualification requirement.

8. The system of claim 7, further comprising switching circuitry configured to selectively couple the plurality of output nodes with the comparator circuitry for the comparisons.

9. An electronic device comprising:
a circuit combination of an input/output (I/O) driver circuit and a test circuit coupled to an output node, the circuit combination configured to:
generate a test voltage on the output node at a first level when the I/O driver circuit is configured in a pull up state and the test circuit is configured to sink current from the output node;
generate the test voltage on the output node at a second level when the I/O driver circuit is configured in a pull down state and the test circuit is configured source current from the output node;
comparator circuitry configured to:
perform a first set of comparisons of the test voltage at the first level with a reference voltage at a plurality of high reference levels; and
perform a second set of comparisons of the test voltage at the second level with the reference voltage at a plurality of low reference levels;
output comparison result signals indicative of the results of the first and second sets of comparisons to a test controller, and
wherein the test controller is configured to:
identify the first level relative to the plurality of high reference levels and the second level relative to the plurality of low reference levels in response to receipt of the comparison result signals.

10. The electronic device of claim 9, wherein the first level corresponds to a minimum high level and the second level corresponds to a maximum low level associated with the I/O driver circuit.

11. The electronic device of claim 9, wherein the test controller is further configured to:
generate reference control signals to cause reference generation circuitry to sequentially generate the reference voltage at the plurality of high reference levels during a first test cycle and to cause the reference generation circuitry to sequentially generate the reference voltage at the plurality of low reference levels during a second test cycle.

12. The electronic device of claim 9, further comprising an integrated circuit comprising analog circuitry and digital circuitry,
wherein the analog circuitry comprises the comparator circuitry and an analog portion of the test controller, the analog portion configured to output a switching control signal to the test circuit to control the sourcing of current to and the sinking of current from the output node, and
wherein the digital circuitry comprises a digital portion of the test controller that is configured to output a test cycle enable signal to the analog portion that identifies whether the test circuit is to sink or source current to the output node.

13. The electronic device of claim 12, wherein the analog circuitry further comprises:
current mirror circuitry configured to form a current mirror connection with the test circuitry,
wherein the current that is sourced to and sunk from the output node is mirrored from source current flowing through the current mirror circuitry.

14. A system comprising:
an input/output (I/O) driver circuit comprising an output node configured to generate a test voltage at a test level associated with one of a minimum high level or a maximum low level;
comparator circuitry configured to compare the test voltage at the test level with a reference voltage at a plurality of reference levels associated with the one of the minimum high level or the maximum low level; and
a test controller configured to identify an output voltage range for the I/O driver circuit based on the comparison of the test voltage at the test level with the reference voltage at the plurality of reference levels.

15. The system of claim 14, wherein the I/O driver circuit is further configured to:
pull down the test level of the test voltage while turning on a first switch to source current to the output node in response to the test level being associated with the maximum low level; and
pull up the test level of the test voltage while turning on a second switch to sink current from the output node in response to the test level being associated with the minimum high level.

16. The system of claim 15, further comprising:
current mirror circuitry configured to mirror a source current to at least one of: source the current to the output node or sink the current from the output node.

17. The system of claim 16, further comprising:
reference generation circuitry configured to sequentially output the reference voltage at the plurality of reference levels,
wherein the comparator circuitry is further configured to sequentially output a plurality of comparator output signals to indicate results of the comparison of the test voltage with the reference voltage at the plurality of reference levels.

18. The system of claim 14, wherein the test level comprises a first test level, the plurality of reference levels comprises a plurality of first reference levels, the output voltage range comprises a first output voltage range, and wherein:
the output node is configured to generate the test voltage at a second test level associated with the other of the minimum high level or the maximum low level after generation of the test voltage at the first test level and the comparison of the test voltage at the first test level with the reference voltage;

the comparator circuitry is configured to compare the test voltage at the second test level with the reference voltage at a plurality of second reference levels associated with the other of the minimum high level or the maximum low level; and the test controller is configured to identify a second output voltage range for the I/O driver circuit based on the comparison of the test voltage at the second test level with the reference voltage at the plurality of second reference levels.

19. The system of claim 18, wherein the test controller comprises a first test controller and a second test controller, and wherein, after a last comparison of the test voltage at the first test level with the reference voltage at a last of the plurality of first reference levels, the first test controller is configured to output a ready signal to indicate to the second controller to read a plurality of indication signals indicating the comparisons of the test voltage at the first test level with the reference voltage at the plurality of first reference levels.

20. The system of claim 14, wherein the test circuitry comprises first test circuitry, the test voltage comprises a first test voltage, the output node comprises a first output node, the I/O driver circuit comprises a first I/O driver circuit, and the output voltage range comprises a first output voltage range, the system further comprising:

switching circuitry configured to, after the comparison of the first test voltage with the reference circuit, decouple the first output node from the comparator circuitry and couple a second output node with the comparator circuitry, the second output node coupled to second test circuitry and a second I/O driver circuit; and a second node of a second I/O driver circuit configured to generate a second test voltage at a second level associated with one of the minimum high level or the maximum low level, wherein the comparator circuitry is configured to compare the second test voltage at the second test level with the reference voltage at the plurality of reference levels associated with the one of the minimum high level or the maximum low level, and wherein the test controller is configured to identify a second output voltage range for the second I/O driver circuit based on the comparison of the second test voltage at the second level with the reference voltage at the plurality of reference levels.

21. A system comprising:

test circuitry coupled to an output node of an input/output (I/O) driver circuit, wherein the test circuitry and the I/O driver circuit are configured to generate an output voltage on the output node at a first level associated with a minimum logic high level and a second level associated with a maximum logic low level, wherein the test circuitry is further configured to at least one of:

sink current from the output node to generate the output voltage at the first level associated with the minimum logic high level, or source current to the output node to generate the output voltage at the second level associated with the maximum logic low level;

comparator circuitry configured to compare the output voltage at the first level and the second level with a reference voltage; and a test controller configured to output an indication signal based on the comparison, the indication signal indicating that the I/O driver circuit does not satisfy a parametric qualification requirement.

* * * * *